United States Patent [19]

Reinberg et al.

[11] 4,431,898

[45] Feb. 14, 1984

[54] INDUCTIVELY COUPLED DISCHARGE FOR PLASMA ETCHING AND RESIST STRIPPING

[75] Inventors: Alan R. Reinberg; George N. Steinberg, both of Westport; Charles B. Zarowin, Rowayton, all of Conn.

[73] Assignee: The Perkin-Elmer Corporation, Norwalk, Conn.

[21] Appl. No.: 298,416

[22] Filed: Sep. 1, 1981

[51] Int. Cl.³ .................. B23K 9/00; B01K 1/00
[52] U.S. Cl. .................. 219/121 PG; 219/121 PD; 219/121 PF; 156/646; 204/164
[58] Field of Search .................. 219/121 PD, 121 PE, 219/121 PG, 121 PF, 10.75, 10.71; 204/192 E, 210, 164; 156/643, 646

[56] References Cited

U.S. PATENT DOCUMENTS

| | | | |
|---|---|---|---|
| 3,187,152 | 6/1965 | Itoya | 219/10.71 |
| 3,432,296 | 3/1969 | McKinnon et al. | 219/121 PR |
| 3,586,905 | 6/1971 | Bignell | 219/121 PR |
| 4,065,369 | 12/1977 | Ogawa et al. | 219/121 PG |
| 4,123,663 | 10/1978 | Horiike | 219/121 PG |
| 4,361,749 | 11/1982 | Lord | 219/121 PR |

OTHER PUBLICATIONS

IBM, vol. 21, No. 12, May 1979, "High Rate Triode Plasma Etching of Si".
"Glow Discharge Phenomena in Plasma Etching and Plasma Deposition", vol. 26, #2, pp. 319-324, Solid State Science & Technology, 2/1979.
"Triode System for Plasma Etching", IBM, vol. 21, #12, 5/1979.

Primary Examiner—M. H. Paschall
Attorney, Agent, or Firm—T. P. Murphy; E. T. Grimes; F. L. Masselle

[57] ABSTRACT

Apparatus for plasma etching of semiconductor devices. A plasma chamber is inductively coupled to a source of A.C. power wherein the semiconductor devices are etched. Alternately, the semiconductor devices may be etched or stripped at a location downstream of the plasma chamber.

6 Claims, 3 Drawing Figures

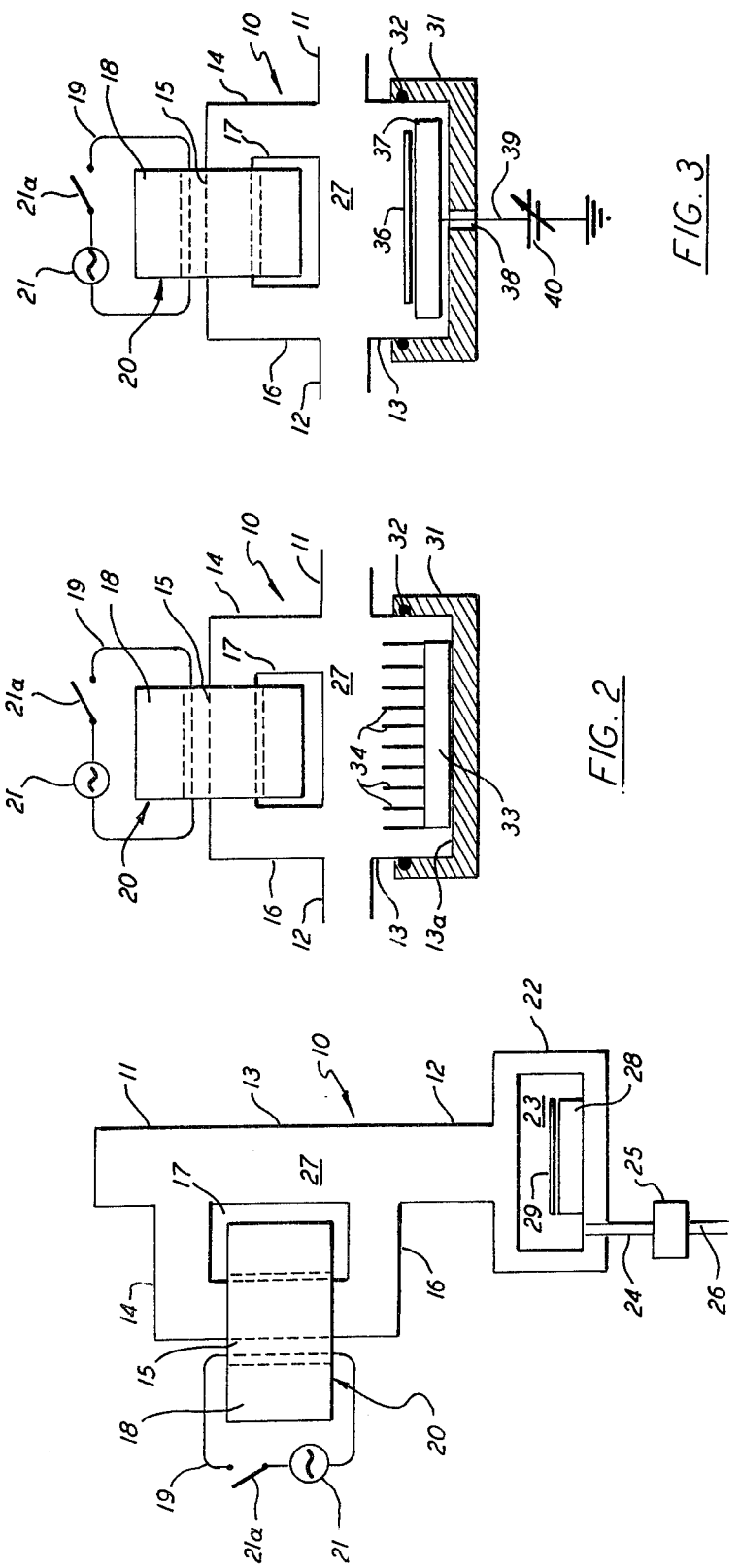

INDUCTIVELY COUPLED DISCHARGE FOR PLASMA ETCHING AND RESIST STRIPPING

BACKGROUND OF THE INVENTION

Plasma or dry etching is a well known technique used in the fabrication of integrated circuits wherein gas which has been dissociated into positive and negative ions and radicals reacts with unprotected areas of a material disposed on a substrate to remove selected portions of the material from the substrate. The etching generally takes place in a chamber containing the etching gas which is formed into plasma by the application of R.F. power in a controlled pressure environment. Also, etching or stripping may take place downstream from the plasma chamber by transporting the reactive species from the plasma chamber to an area containing the devices to be etched or stripped.

Probably the most common method of supplying power to an etching chamber is by direct coupling. In this method electrodes are disposed within the plasma chamber and directly connected to an A.C. power source. In such a method discharges occur between the electrodes which introduce process artifacts by sputtering, chemical reaction, release of entrapped and/or absorbed impurities. These artifacts or contaminates are released in particle or gaseous form and settle onto the semiconductor device often destroying the usefulness of the device.

This problem has been overcome in the past by capacitive coupling in which the power source is indirectly coupled to the plasma chamber. By such coupling electrodes are not within the plasma chamber and the problem of electrode discharge and the contaminants formed thereby is overcome.

However, capacitive coupling between power source and plasma chamber introduces the necessity of using high frequency sources of power. This is so because as frequency is lowered in a capacitively coupled arrangement more of the power is dissipated in the coupling and less by the intended plasma load. Thus, in capacitive coupling the apparatus is efficient only at high frequencies. The necessity of using such high frequencies may cause damage or breakdown of the coupling structure since at high power requirements prohibitively large voltages appear across the coupling. In addition, the cost of such a system is high because high frequency power generators typically cost significantly more than low frequency power sources.

The present invention eliminates the disadvantages of capacitive coupling while also eliminating the problems associated with direct coupling.

BRIEF SUMMARY OF THE INVENTION

The present invention relates to a plasma etching apparatus wherein the A.C. power source is inductively coupled to the plasma chamber.

The embodiments of the present invention generally comprise a plasma chamber comprising a tube forming a continuous closed path which is topologically toroidal. The plasma chamber has an inlet opening through which a plasma gas or gases enter the chamber and an outlet through which spent gases are evacuated from the plasma chamber. A transformer core couples an A.C. power source to the plasma chamber. The transformer comprises a high permeability magnetic core material such as a ferrite encircling a portion of the tube and passing through the toroidal central opening. The core links the primary winding of one or more turns to a source of A.C. power with the plasma as the continuous closed path forming a single turn secondary. Connection of the A.C. source to the primary generates current flow in the continuous path of the tube to ionize the etching gas thereby generating the etching plasma. Devices such as films on silicon wafers to be etched may be disposed within the plasma chamber or disposed downstream between the plasma chamber and the outlet for etching or stripping, i.e., removing photoresist.

The plasma chamber may contain a conductive platform for holding the wafer and additional electrodes. The conductive platform is connected to a variable source of voltage. By adjusting the voltage to the conductive plate the degree of anisotopic etching and/or the etch rate may be controlled.

BRIEF DESCRIPTION OF THE DRAWINGS

FIG. 1 is a schematic representation of an embodiment of the present invention useful for downstream stripping of a silicon wafer;

FIG. 2 is a schematic representation of another embodiment of the present invention useful for etching one or more silicon wafer; and FIG. 3 is a schematic representation of a further embodiment of the present invention employing a conductive platform for the wafer and additional electrodes for control.

DESCRIPTION OF THE INVENTION

Referring now to FIG. 1 there is shown a tube structure 10. The tube structure 10 may be made of pyrex or any similar non-conductive glass, ceramic or heat resistant plastic material. The tube structure comprises a gas inlet portion 11 and a gas outlet portion 12.

The gas inlet 11 is normally connected to a source (not shown) of etching gas or gases while the outlet portion is connected to a pump or vacuum source. Other means (not shown) normally regulate the flow rate of etching gas in and spent gas out and maintain the pressure within the tube structure at some desired value. Such a flow rate and pressure control means is described in U.S. Application Ser. No. 223,197 entitled, "Molar Gas-Flow Controller" having the same assignee as the present application.

The tube structure 10 comprises four legs 13, 14, 15 and 16 which form a continuous closed path around an opening 17. The tube structure 10 is topologically toroidal. The essential feature is that the gas discharge current path therein be in a complete loop, through the central opening of which the magnetic fluxes of primary and secondary are linked.

Disposed through the opening 17 and encircling leg 15 of the tube structure 10 is a transformer core 18 made of magnetic material such as ferrite or similar magnetically permeable material.

A primary winding 19 of one or more turns is looped about core 18. The continuous path formed about the core 18 by the tube structure 10 acts as a secondary winding thus completing a transformer 20.

The primary winding 19 is connected to a source 21 of A.C. voltage via switch 21a so that when switch 21a is closed current is caused to flow about the continuous loop of legs 13, 14, 15 and 16. This current generates a plasma from the gases within the loop volume wherein, for example, etching of films on silicon wafers may be performed.

The foregoing describes a system wherein the power source is inductively coupled to the plasma generating apparatus which has the advantages pointed out above, i.e., overcoming the problems associated with both direct and capacitive coupling.

The embodiment of FIG. 1 is essentially designed for downstream etching wherein the reactive species of the generated plasma is transported downstream from the plasma to a remote etching or stripping chamber.

Thus, in the embodiment of FIG. 1, inner volume 23 of etching or stripping chamber 22 communicates with the plasma chamber 27 of the tube structure 10 via outlet portion 12. The inner volume 23 of etching chamber 22 is connected to a pump 25 by port 24 for evacuating gases via port 26 maintaining pressure within volume 23 and in the plasma chamber 27 at a value suitable for etching. Pump 25 also causes the reactive species generated in volume 27 to be tranported to volume 23 where etching or stripping is performed. Chamber 22 has disposed therein a platform 28 for supporting a wafer 29 to be etched or stripped.

FIG. 2 illustrates an embodiment of the present invention in which etching takes place in the chamber where the plasma is generated as opposed to downstream etching. The plasma generating structure of FIG. 2 is basically similar to that of FIG. 1 and different reference numerals are used only where necessary to avoid confusion.

The embodiment of FIG. 2 comprises a tube structure 10. Tube structure 10 which is made up of legs 13, 14, 15 and 16 form an opening 17 and, therefore, a continuous path. Leg portion 13 encloses a larger volume than leg 13 of FIG. 1. The volume within leg 13 should be sufficiently large to house one or more wafers therein as discussed below.

The bottom of leg 13 is open to permit free access to the plasma chamber or volume 27. A jacket 31 made of insulating material is disposed about the end of leg 13. The jacket 31 closes the open end of leg 13 in a fit made gas tight by any convenient means, e.g., O-ring 32. The jacket 31 is removable to permit the free insertion and removal of wafers into and out of plasma chamber 27. A platform 33 rests on the bottom portion 31a of jacket 31 for supporting a plurality of wafers 34 in an upright or flat position. The wafers 34 may be held in position by any convenient means.

The tube structure 10 also has an inlet 11 for receiving etching gases into chamber 27 and an outlet 12 connected to a source of vacuum, e.g., a pump similar to pump 25 of FIG. 1 for evacuating spent gases from plasma chamber 27 and maintaining the pressure within chamber 27 at a desired value.

A transformer 20 comprises a ferrite or other appropriate magnetic material core 18 which encircles leg 15 and passes through opening 17 has a primary winding 19 of one or more turns. The transformer 20 of FIG. 2 functions identically as the transformer 20 of FIG. 1 and provides an inductively coupled A.C. power source 21 to generate a current in the continuous path of plasma chamber 27 formed by legs 13, 14, 15 and 16 which is the secondary of the transformer 20. This current generates a plasma of the etching gases to thereby perform etching of wafers 34.

FIG. 3 is substantially identical to FIG. 2 except that FIG. 3 includes within plasma chamber 27 a conductive platform 37 on which one or more wafers 36 may rest. Conductive platform 37 is connected to a source of variable voltage 40, via conductor 39 which passes through the bottom portion 31a of jacket 31. Source 40 is a source of d.c. or a.c. voltage which may be varied to set the level of sheath voltage between the plasma and substrate, i.e., wafer 36, which voltage determines the manner in which ions are transported to the substrate. In some embodiments it may be necessary to add an additional electrode in contact with the plasma as a reference to the applied potential to the wafer. For a.c. bias this electrode may be outside the chamber and capacitively coupled to the plasma.

A major advantage of inductive coupling of the apparatus of FIG. 3, is that it is not necessary to apply power directly through the plasma sheath. Consequently, the generation of plasma may be independently controlled by source 40 and conductive platform 37. While an additional advantage of this system is that it is equally applicable at high and low pressures, it is particularly important at high pressure where inductive coupling provides uniform high power excitation and by adjusting the bias, allows arbitrary adjustment of the ion transport to the wafer surface.

In all other respects, the embodiment of FIG. 3 functions identically to the embodiments of FIG. 2 and FIG. 1.

While the electrical parameters of the various figures are to a large extent a function of the geometry and type of etching desired, some typcial examples of the electrical parameters are as follows: The power applied to the plasma chamber may vary between 100 and 300 watts and the input voltage supplied to the primary 19 which in a practical embodiment is a two-turn primary would be 100 volts, thereby causing 50 volts to appear on the secondary. The current flowing in the plasma chamber 27 may be in the range of 2 amps to 5 amps. The pressure in the chamber 23 may be of the order of 0.5 Torr but its maximum value depends on the transformer voltage and geometry of the apparatus and can go substantially above one atmosphere.

While the frequency of the input voltage may be as low or lower than 60 cycles per second, a typical range of frequency for the input voltage is between 20 kilohertz and 1 megahertz. In any event, this is a substantial reduction from the required frequency of the input voltage where capacitive coupling is used which should be at least in the range of 10 megahertz.

It should also be noted, that even in inductive coupling there is a capacitive reactance which must be considered when source frequency is high. Thus, if in inductive coupling the frequencies go much above the 1 megahertz, some capacitive coupling may be encountered.

Other modifications and variations of the present invention are possible in the light of the above disclosure, which should not be construed as placing limitations upon the invention other than those limitations set forth in the claims which follow:

What is claimed is:

1. An apparatus for the plasma etching of semiconductor devices comprising,
   a plasma chamber comprising tubing means defining a continuous discharge path about an opening through said plasma chamber,
   a power source,
   transformer means for inductively coupling said power source to said plasma for generating a plasma therein,
   platform means made of electrically conductive naterial disposed in such plasma chamber for supporting one or more semiconductor devices to be etched, a variable source of d.c. or a.c. voltage connected to said platform for controlling the level of sheath voltage between said plasma and said semiconductor device.

2. An apparatus according to claim 1 wherein said transformer means comprises:

a highly permeable magnetic core disposed about a portion of said tube and passing through said opening;

a primary winding encircling said core connected to said power source, said continuous discharge path acting as the secondary winding of said transformer means.

3. An apparatus according to claim 2 further including:

a chamber means connected in said egress means remote from said plasma chamber, pump means connected to said chamber means causing species from said plasma in said plasma chamber to be transported to said chamber means whereby wafers disposed in said chamber means are stripped of photoresist.

4. An apparatus according to claim 2 further including, pump means connected to said egress means for transporting etching gases through said plasma chamber and maintaining pressure in said plasma chamber at a desired value.

5. An apparatus according to claim 3 in which the turns ratio of said transformer means is n : 1 where n may be any predetermined number.

6. An apparatus according to claim 4 in which the turns ratio of said transformer means is n:1 where n may be any predetermined number including fractional numbers.

* * * * *